United States Patent [19]
Imai et al.

[11] Patent Number: 4,851,712
[45] Date of Patent: Jul. 25, 1989

[54] SEMICONDUCTOR CIRCUIT FOR DRIVING A LOAD CIRCUIT WITH POWER SUPPLIED INDEPENDENTLY

[75] Inventors: Shin-ichi Imai, Yokohama; Akira Sakata, Tokyo, both of Japan

[73] Assignee: Kabushiki Kaisha Toshiba, Kawasaki, Japan

[21] Appl. No.: 79,148

[22] Filed: Jul. 29, 1987

[30] Foreign Application Priority Data

Jul. 30, 1986 [JP] Japan ................. 61-177715

[51] Int. Cl.$^4$ ............................................. H03K 3/01
[52] U.S. Cl. ............................. 307/296.1; 307/296.6
[58] Field of Search ............... 307/296.6, 296.7, 296.8, 307/296.1

[56] References Cited
PUBLICATIONS

"VSLI Silicon Compilation and the Art of Automatic Microchip Design", by Ronald Ayres, 1983, Prentice-Hall Inc.

Sauer, et al., "A CCD Comb Filter IC for TV Receivers," IEEE International Solid-State Circuits Conference, ISSCC Digest of Technical Papers, pp. 32–33, Feb. 13, 1980.

Primary Examiner—John S. Heyman
Assistant Examiner—Richard Roseen
Attorney, Agent, or Firm—Finnegan, Henderson, Farabow, Garrett, & Dunner

[57] ABSTRACT

In a semiconductor circuit including a wave shaper circuit and a driver circuit, the wave shaper circuit is supplied with the reference potential via a wiring, which is provided independent of a wiring for supplying the reference potential to a driver circuit. With this feature, a variation in the potential of the wiring for supplying the reference potential to the wave shaper circuit is minimized.

20 Claims, 13 Drawing Sheets

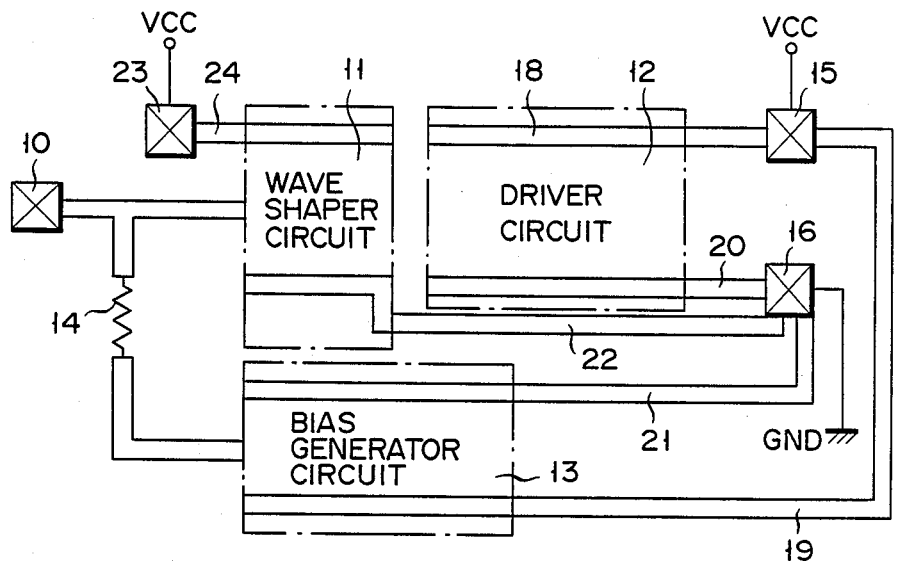
F I G. 14
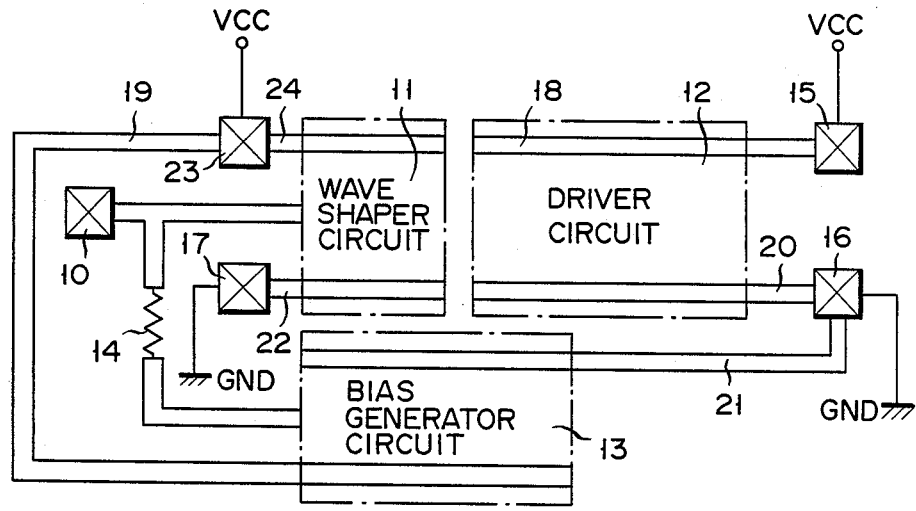
F I G. 15

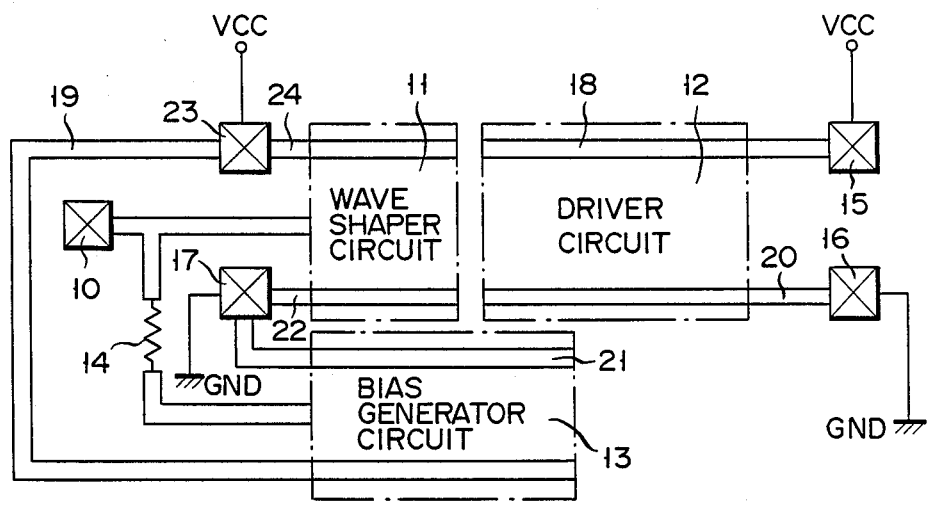
F I G. 16
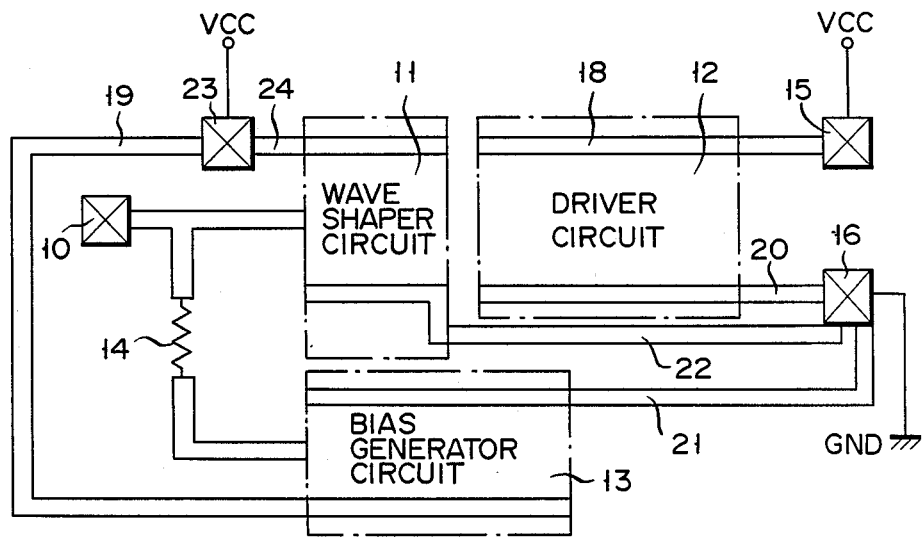
F I G. 17

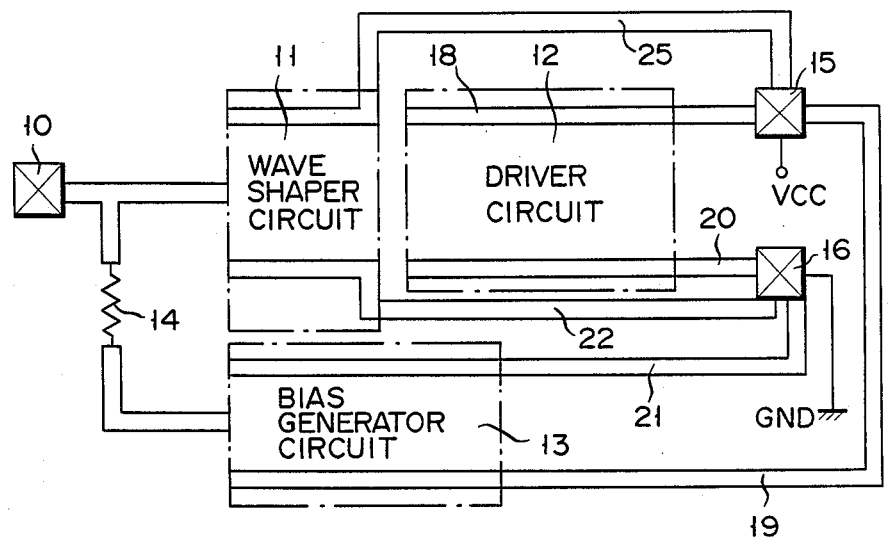
F I G. 20
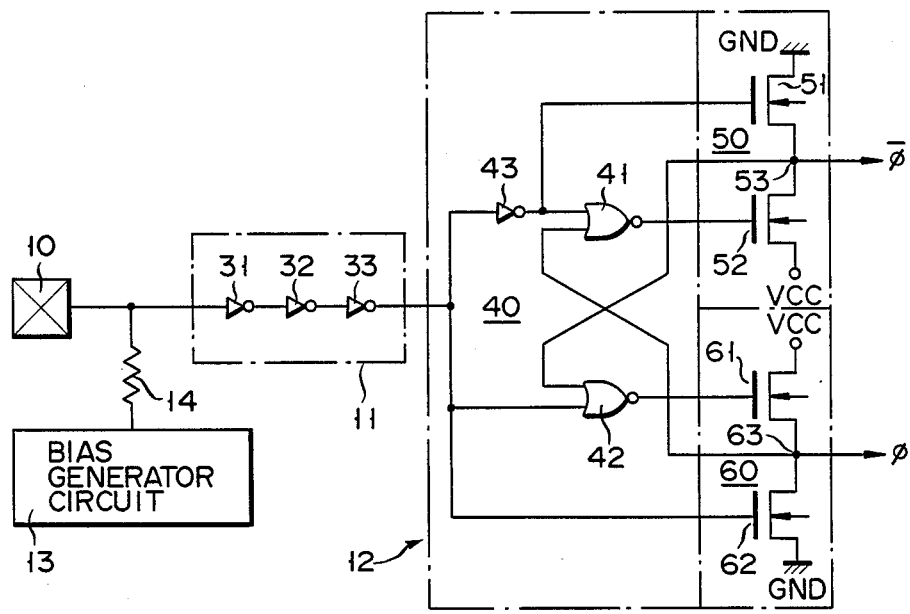
F I G. 21

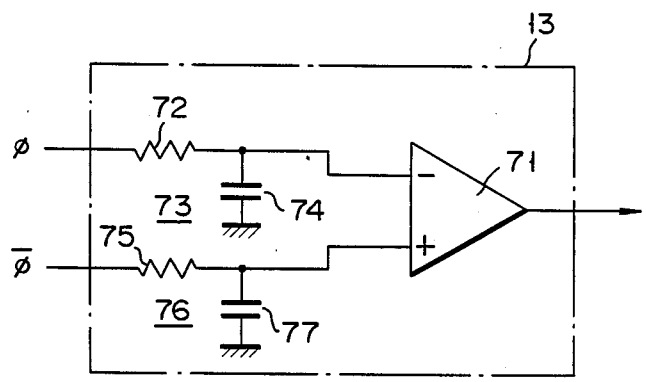
F I G. 22
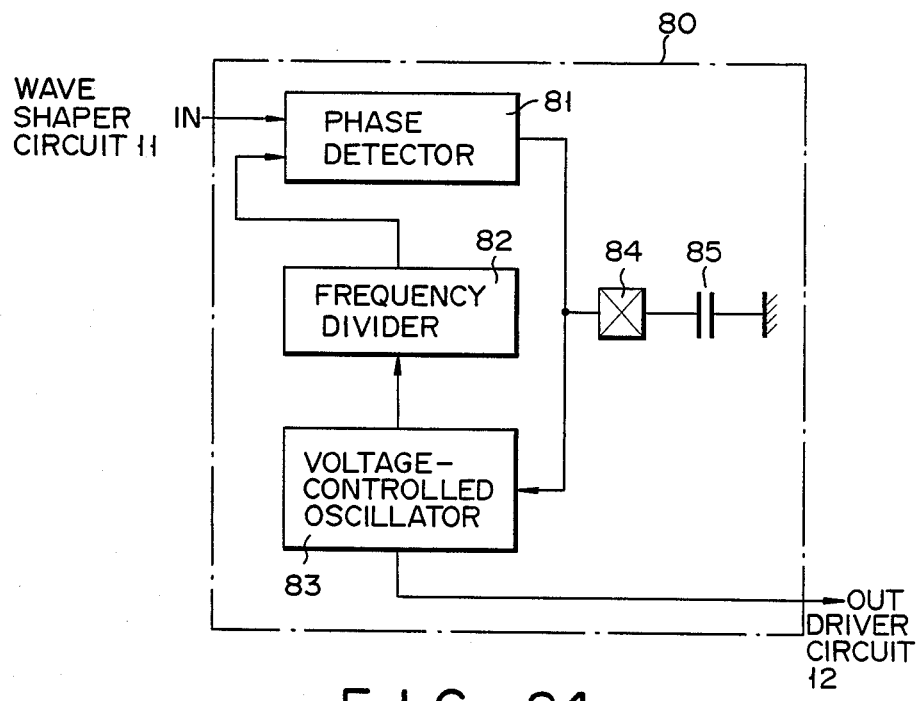
F I G. 24

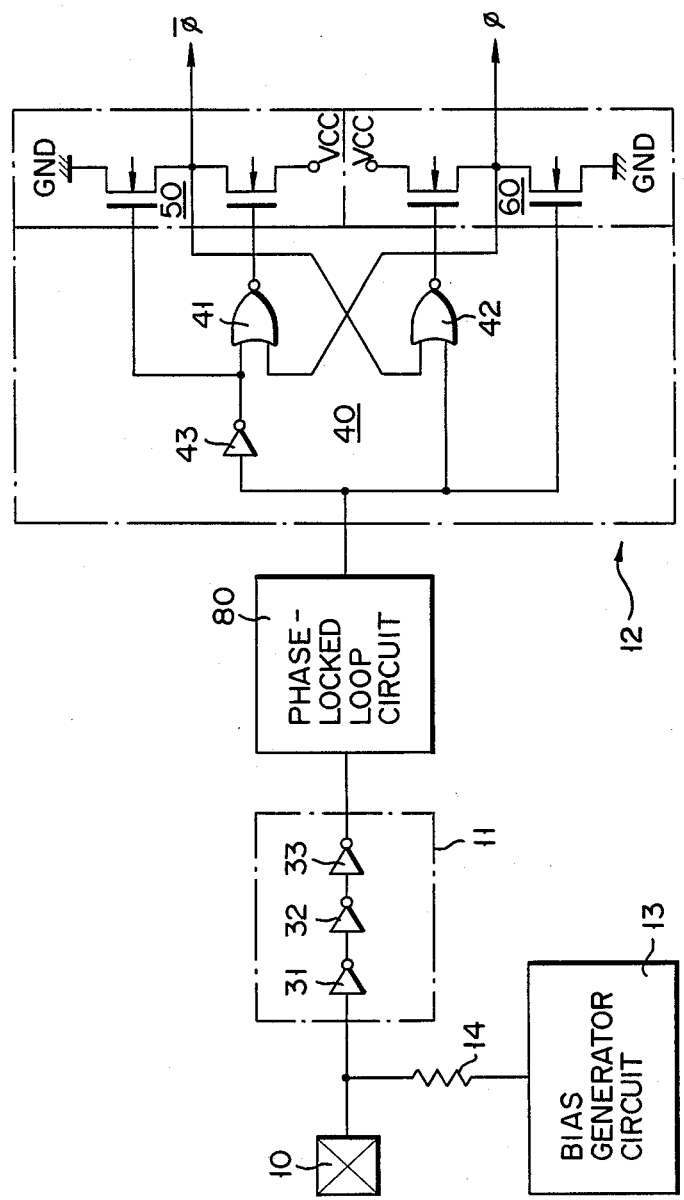
F I G. 23

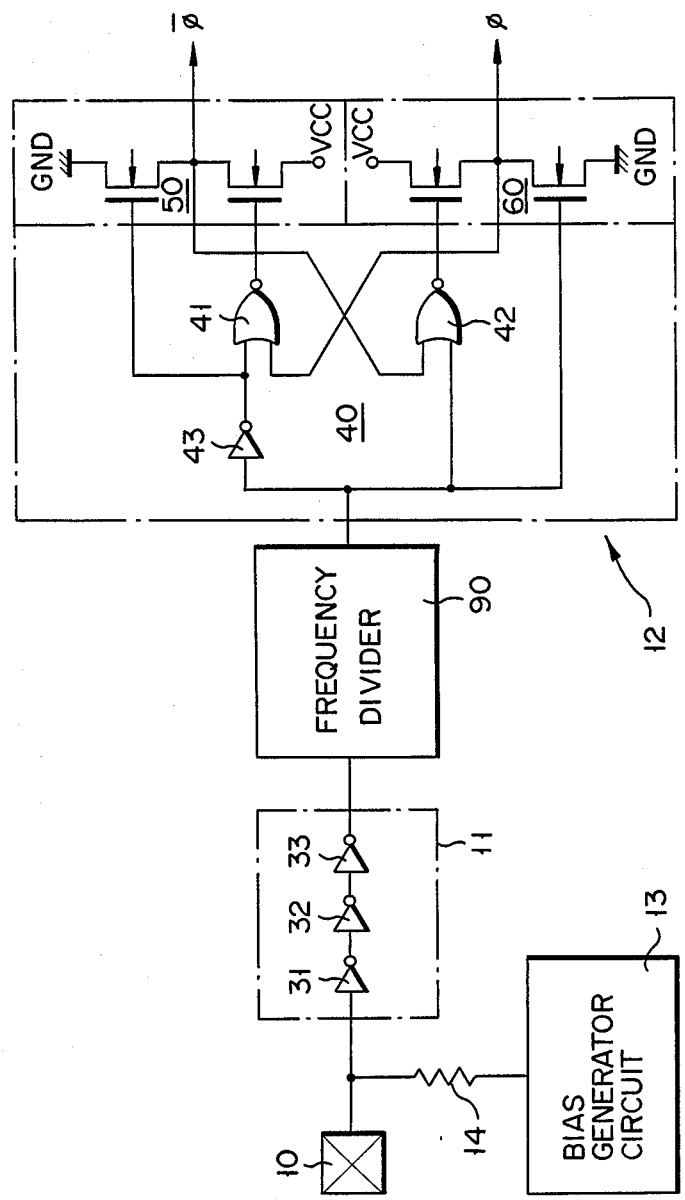
F I G. 25

SEMICONDUCTOR CIRCUIT FOR DRIVING A LOAD CIRCUIT WITH POWER SUPPLIED INDEPENDENTLY

BACKGROUND OF THE INVENTION

This invention relates to a semiconductor circuit for driving a load circuit with a relatively large load capacity by using a signal which is formed by amplifying and wave-shaping a small input signal.

In integrated circuits for high frequency pulse signals e.g. video signals of several MHz, a sine or triangle wave signal with relatively small amplitude is used for the clock signal. In the integrated circuit (IC) receiving such a small amplitude clock signal, a predetermined DC bias voltage is applied to the input clock signal, and the biased clock signal is input to a wave shaper circuit. The wave shaper circuit amplifies and wave shapes the clock signal into a rectangular or trapezoidal wave signal with such an amplitude as to operate the driver circuit at the next stage. The wave shaped pulse signal is input to the driver circuit, which in turn converts it into a clock pulse signal with an amplitude large enough to drive a load circuit on the IC chip, with a large load capacity such as wiring capacities. This clock pulse signal is input to the load circuit to control the operation thereof.

Since the wave shaper circuit and the driver circuit are arranged in successive stages, and the IC chip area should be effectively used, a power supply line of a reference potential (ground potential) and a power supply line of a power source potential are commonly connected to the wave shaper circuit and the driver circuit for operating the circuits.

FIG. 1 shows a block diagram illustrating a configuration of the prior integrated circuit which includes a wave shaper circuit, a driver circuit and others. In the figure, reference numeral 100 denotes a bonding pad for signal input, which is coupled with a sine or triangular wave signal with a small amplitude as a clock signal. Reference numeral 101 denotes a wave shaper circuit. Numeral 102 denotes a driver circuit. Numeral 103 denotes a bias generator circuit for generating a DC bias voltage to be applied to the input clock signal. The DC bias voltage generated by bias generator circuit 103 is applied to pad 100 via resistor 110. 104 denotes a bonding pad for supplying the power source potential Vcc. 105 denotes a bonding pad for supplying the reference potential (ground potential GND).

The power source potential Vcc supplied to pad 104 is supplied to wave shaper circuit 101 and driver circuit 102 via common wiring 106, and is also supplied to bias generator circuit 103 via wiring 107. The reference potential GND supplied to pad 105 is supplied to wave shaper circuit 101 and driver circuit 102 via common wiring 108, and is also supplied to bias generator circuit 103 via wiring 109.

The final stage circuit of driver circuit 102 has a configuration shown in FIG. 2, for example. Reference numeral 121 denotes a P channel MOS transistor. Numeral 122 denotes an N channel MOS transistor. The source of transistor 121 is connected to power source potential Vcc. The source of transistor 122 is connected to the reference potential GND. The gates of transistors 121 and 122 are connected with each other. A pulse signal is supplied at the connection point of the bases of transistor 121 and 122. Load capacitance 123 is connected between the connection point of its drains of transistors 121 and 122 and the reference potential GND. The load capacitance 123 equivalently represents the load capacitance of a load circuit driven by an output clock pulse signal of driver circuit 102. Since it is necessary for driver circuit 102 to drive a relatively large load capacitance, transistors 121 and 122 are designed so as to have relatively large sizes.

The instantaneous AC current Iac flowing into the final stage circuit when the pulse signal is input to driver circuit 102 is given by the following expression $$Iac = f \cdot C \cdot V \tag{1}$$

where f represents the frequency of the output clock pulse signal of the final stage circuit, C represents the value of load capacitance 123, and V represents the value of the power source potential Vcc. As seen from the expression (1), as f and/or C increases, instantaneous AC current Iac flowing into the final stage of driver circuit 102 increases.

FIG. 3 shows an equivalent circuit of wave shaper circuit 101 and driver circuit 102 in the integrated circuit of FIG. 1, as viewed from reference potential supplying pad 105. As shown in the figure, resistance r1 and inductance l1 parasitic to wiring 108 are connected in series between wave shaper circuit 101 and driver circuit 102. Resistance r2 and inductance l2 parasitic to wiring 108 are connected in series between driver circuit 102 and pad 105. These resistances r1 and r2 and inductances l1 and l2 are connected in series between wave shaper circuit 101 and pad 105. Instantaneous AC current Iac as given by expression (1) flows into resistance r2 and inductance l2 connected between pad 105 and driver circuit 102, and, consequently, the potential of wiring 108 varies at fixed periods as determined by the fundamental wave component and the harmonic components of the instantaneous AC current. Therefore, when the integrated circuit in FIG. 1 is operated with relatively small amplitude signals, the operating point of the wave shaper circuit 101 shifts due to the potential variation in wiring 108, possibly resulting in erroneous operation of the integrated circuit.

One of the approaches to cope with this problem is to increase the amplitude of the pulse signal to be input to pad 100. In such a case, the integrated circuit necessarily handles a high amplitude signal. However, such signal creates another problem of cross talk of the pulse signal to other circuits assembled on the same semiconductor chip.

Another approach, which may have potential, is to widen the width of reference potential wiring 108, to reduce the wiring impedance. To reduce the wiring impedance to a satisfactory degree, however, the width of wiring 108 must be significantly widened. This leads to an undesirable increase of the pattern area on the semiconductor chip, and hinders the improvement of the package density of IC chips.

The above approaches, which have been described in connection with the reference potential wiring, can also be applied to the power source potential wiring.

As described above, the prior art semiconductor circuit for driving a load circuit can not handle large amplitude pulse signals. Also the semiconductor circuit can not accept the widening of power wiring. Therefore, the reference potential and/or power source potential vary due to the instantaneous AC current flowing through the driver circuit. Thus, the prior art semiconductor circuit involves erroneous operation problems due to the potential variation.

SUMMARY OF THE INVENTION

Accordingly, an object of the present invention is to provide a semiconductor circuit which can operate normally even when the input pulse signal has a small amplitude.

According to the present invention, there is provided a semiconductor circuit comprising a signal input terminal, a pulse shaper circuit for amplifying and wave-shaping the signal applied to the input terminal to form a pulse signal, a driver circuit for generating a signal to drive a circuit with a load capacity by using the pulse signal, a bias voltage generator circuit for applying a DC bias voltage to the input signal supplied to the input terminal, and potential supply means for supplying at least one of the reference potential and the power source potential to said wave shaper circuit, separately from the supply of said at least one potential to at least the driver circuit.

In the semiconductor circuit thus arranged, the supply line of reference potential and/or the power source potential to be supplied to the wave shaper circuit is electrically separated from that of those potentials supplied to the driver circuit handling the large current. Therefore, the variation of the reference potential and/or the power potential is minimized.

BRIEF DESCRIPTION OF THE DRAWINGS

FIGS. 12 to 20 show wiring diagrams of other embodiments of the invention, in which the invention is applied to a reference potential wiring layer and a power source potential wiring layer;

FIG. 21 shows a detailed circuit diagram of the circuit of the embodiments;

FIG. 22 shows a detailed circuit diagram of a bias generator circuit incorporated in the circuit of the embodiments;

FIG. 23 shows a circuit diagram of a circuit according to a further embodiment of the invention, in which a phase locked loop circuit is inserted between the wave shaper circuit and the driver circuit;

FIG. 24 shows a detailed circuit diagram of the phase-locked loop circuit; and

FIG. 25 shows a circuit diagram of a circuit according to a still further embodiment of the invention, in which a frequency divider is inserted between the wave shaper circuit and a driver circuit.

DETAILED DESCRIPTION OF THE PREFERRED EMBODIMENTS

Some specific embodiments of this invention will now be described, referring to the accompanying drawings.

Figure 1:
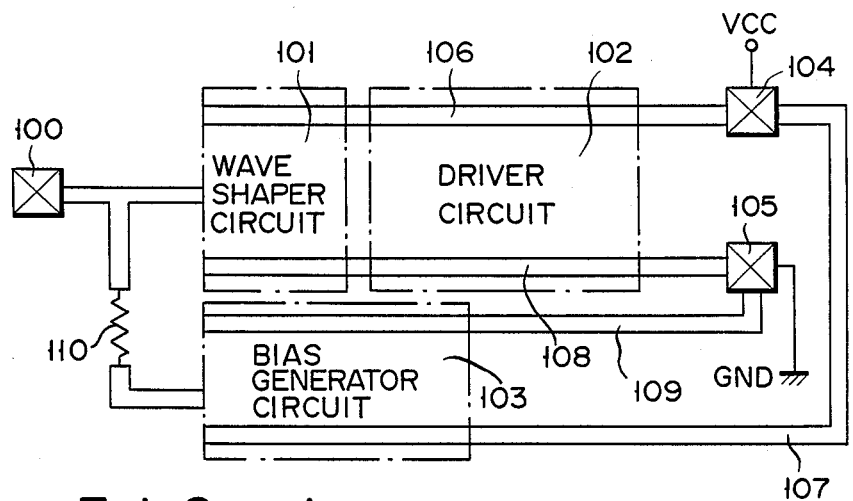
FIG. 1 shows a wiring diagram of a prior art circuit for driving a load circuit.
Figure 2:
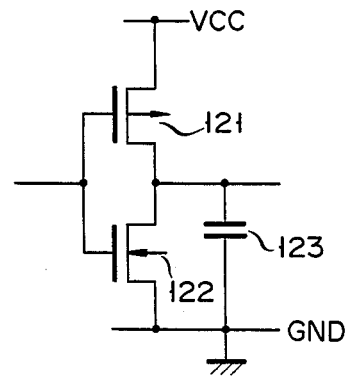
FIG. 2 is a circuit diagram of the final stage of a driver circuit in the circuit shown in FIG. 1.
Figure 3:
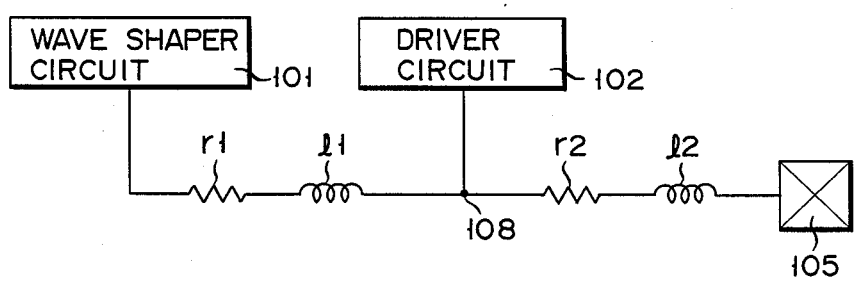
FIG. 3 is an equivalent circuit of the wave shaper circuit and the driver circuit in the circuit shown in FIG. 1, as seen from the reference potential pad.
Figure 4:
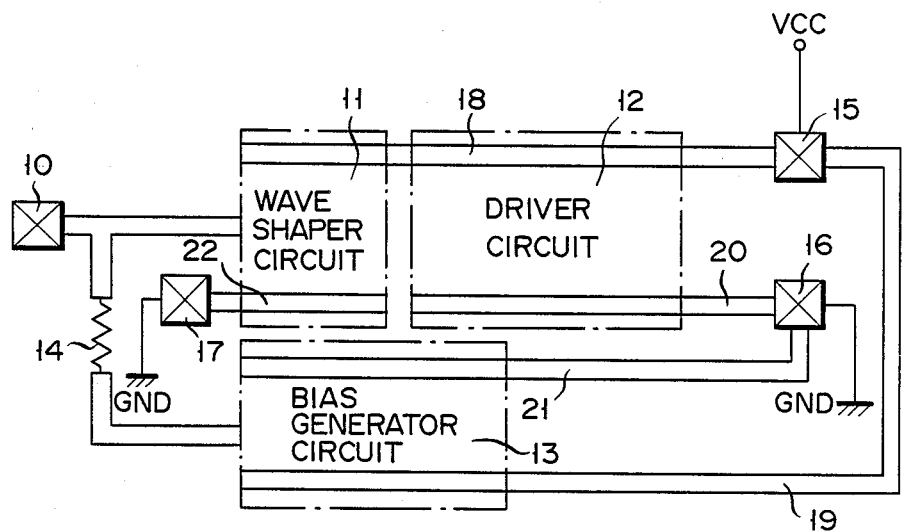
FIG. 4 shows a circuit for driving the load circuit according to an embodiment of the present invention, in which the invention is applied to a reference potential wiring layer.
Figure 5:
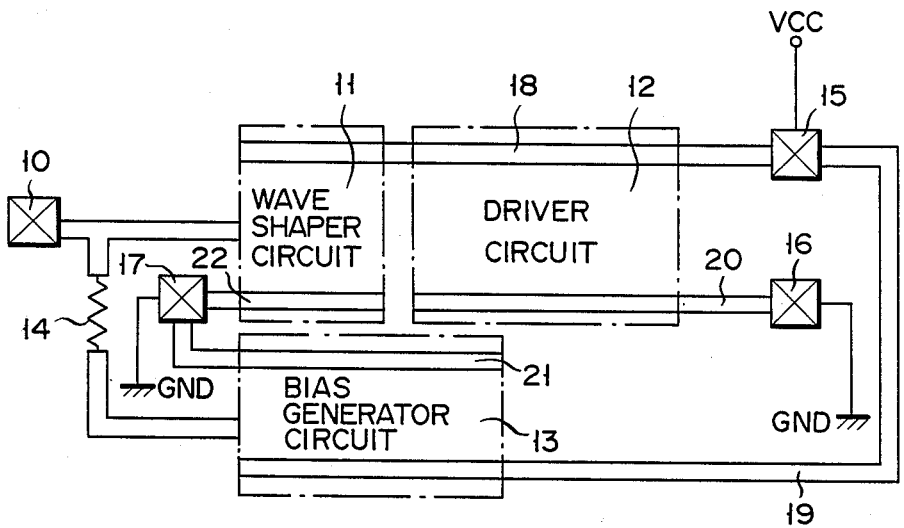
FIGS. 5 and 6 show wiring diagrams of other embodiments of the invention.
Figure 6:
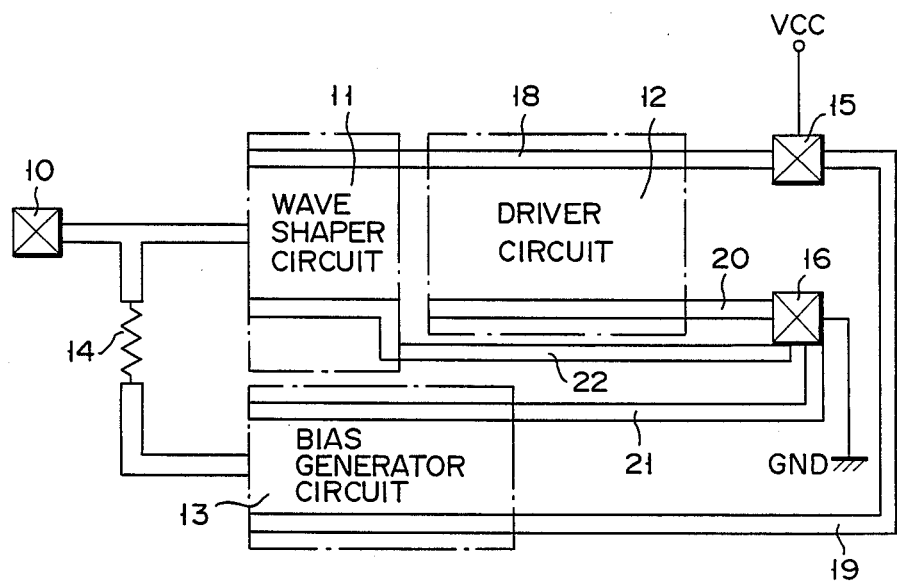

In the embodiments of FIGS. 4 to 6, this invention is applied to the reference potential wiring.

Figure 8:
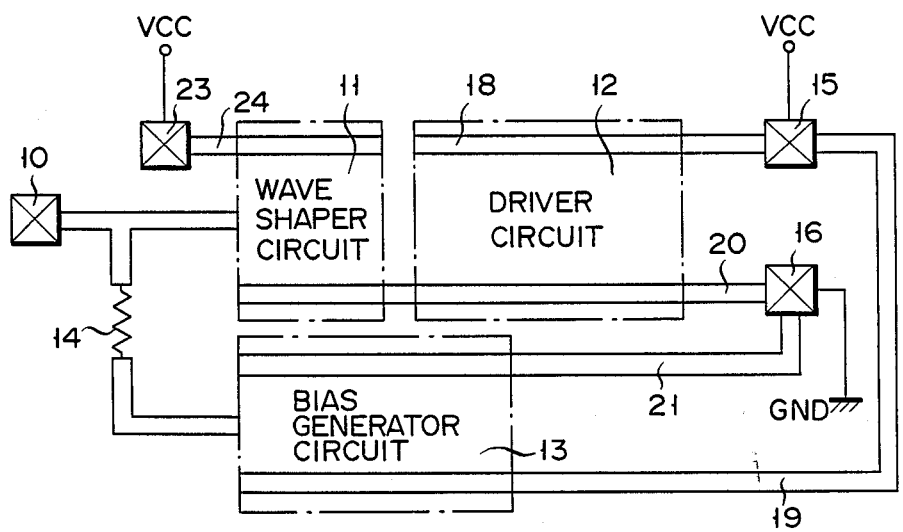
FIGS. 8 to 10 show wiring diagrams of other embodiments of the invention, in which the invention is applied to a power source potential wiring layer.
Figure 9:
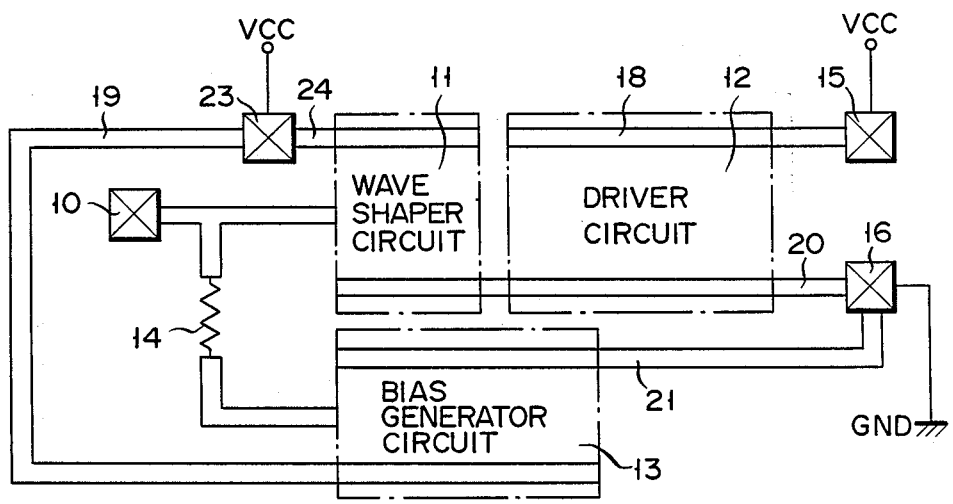
Figure 10:
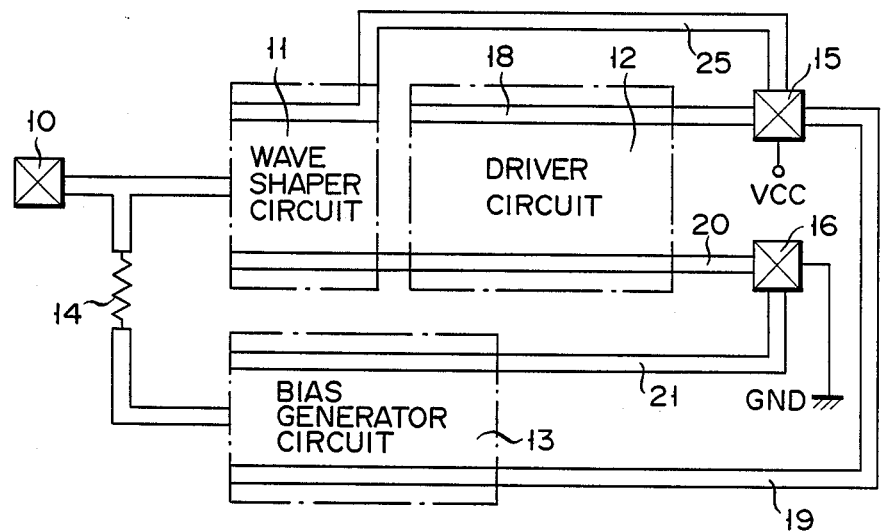

In the embodiments of FIGS. 8 to 10, this invention is applied to the power source potential wiring.

In the embodiments of FIGS. 12 to 20, this invention is applied to both the reference and power source potential wirings.

FIG. 4 shows a block diagram illustrating a configuration of a semiconductor circuit according to a first embodiment of this invention. In the figure, reference numeral 10 denotes a bonding pad for signal input, which is coupled with a sine or triangle wave signal with a small amplitude as a clock signal. Reference numeral 11 denotes a wave shaper circuit for amplifying and wave-shaping the input pulse signal input to generate a clock pulse signal. Numeral 12 denotes a driver circuit for generating a pulse signal for driving a load circuit, i.e., an internal circuit in the semiconductor chip, by using signals from wave shaper circuit 11. Numeral 13 denotes a bias voltage generator circuit for generating a DC bias voltage to be applied to the input pulse signal. The DC bias voltage generated by bias generator circuit 13 is applied to pad 10 via resistor 14.

Numeral 15 denotes a bonding pad for supplying the power source potential Vcc. Numerals 16 and 17 denote bonding pads for supplying the reference potential GND (ground potential). The power source potential Vcc supplied to pad 15 is supplied to wave shaper circuit 11 and driver circuit 12 via common wiring 18, and is also supplied to bias generator circuit 13 via wiring 19. The reference potential GND supplied to pad 16 is supplied to driver circuit 12 via wiring 20, and to bias generator circuit 13 via wiring 21. The reference potential GND supplied to pad 17 is supplied only to wave shaper circuit 11 via wiring 22.

As described above, in the first embodiment, pad 17 for supplying the reference potential GND to wave shaper circuit 11 is provided independently of pad 16 for supplying the reference potential GND to the other circuits. Also, the reference potential supplied to pad 17 is supplied to wave shaper circuit 11 via independent wiring 22.

With such a configuration of the circuit, the reference potential supply system for wave shaper circuit 11 is separated from driver circuit 12 handling a large current. For the reason above, in the reference potential supply system for wave shaper circuit 11, i.e., the circuit path extending from pad 17 to wiring 22, there occurs little variation in the potential due to the instantaneous AC current. Therefore, the point of the intersection of the load line and the static curve (hereinafter referred to as the "operation point") of wave shaper circuit 11 is kept constant. No erroneous operation will occur, even if a clock signal with an amplitude smaller than that conventionally used is input. It should be noted that even if wiring 21 is connected to wiring 20 instead of pad 16, the effect of the invention remains the same.

FIG. 5 shows a block diagram illustrating a configuration of a semiconductor circuit according to a second embodiment of this invention. In the second embodiment, unlike the first embodiment of FIG. 4, wiring 21 for supplying the reference potential GND to bias generator circuit 13 is connected not to pad 16, which is connected to driver circuit 12, but to pad 17, which is connected to wave shaper circuit 11.

Specifically, in this embodiment, pad 17, for supplying the reference potential GND to wave shaper circuit 11, is commonly used in the circuits other than driver circuit 12 handling a large current. Wave shaper circuit 11 is supplied with the reference potential GND from pad 17 via wiring 22.

In this embodiment also, the reference potential supply system for wave shaper circuit 11 is separated from driver circuit 12 handling a large current. Therefore, the operation point of wave shaper circuit 11 is kept constant. No erroneous operation will occur, even if a clock signal with an amplitude smaller than that conventionally used is input.

FIG. 6 shows a block diagram illustrating a semiconductor circuit according to a third embodiment of this invention. Only one pad 16 is provided for supplying the reference potential GND to all the circuits. The reference potential GND is supplied from pad 16 to wave shaper circuit 11 via wiring 22, to driver circuit 12 via wiring 20, and to bias generator circuit 13 via wiring 19.

Namely, in this embodiment, pad 16 is used for supplying the reference potential GND to the circuits including driver circuit 12. Wave shaper circuit 11 is supplied with the reference potential GND via independent wiring 22.

Figure 7:
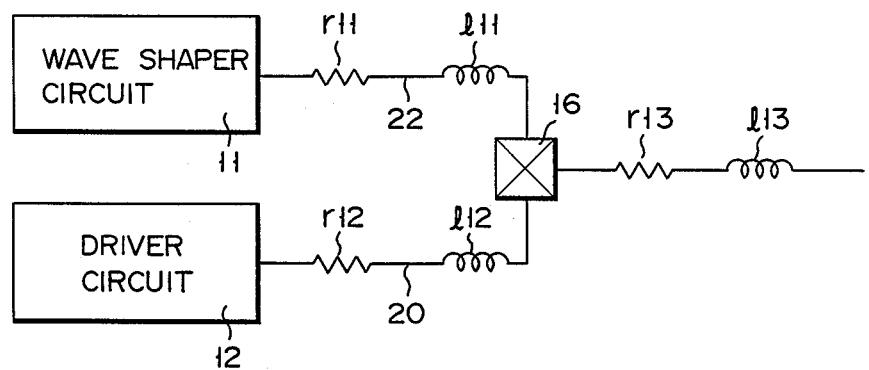
FIG. 7 is an equivalent circuit of the wave shaper circuit and the driver circuit in the circuit shown in FIG. 6, as seen from the reference potential pad.

FIG. 7 shows a diagram of an equivalent circuit of the reference potential wiring and its related circuitry of the circuit shown in FIG. 6. In the figure, resistance r11 and inductance l11 are parasitic to wiring 22. Also, resistance r12 and inductance l12 are parasitic to wiring 20. Resistance r13 and inductance l13 are parasitic to the bonding wire (not shown) connecting pad 16 to an external pin (not shown) of the semiconductor circuit.

In this embodiment, the potential variation of wiring 20 arising from the instantaneous AC current generated by driver circuit 12 is absorbed by the path formed by pad 16, the bonding wire and the external pin. Since the bonding wire and the external pin have some impedance, the potential variation of pad 16 is transferred to wave shaper circuit 11 via wiring 22. However, the potential variation of pad 16 is greatly decreased, compared with that in the prior art circuit. No erroneous operation will occur even, if a clock signal with an amplitude smaller than that used in the prior art is input.

FIG. 8 shows a block diagram illustrating a semiconductor circuit according to a fourth embodiment of this invention. In this embodiment, and the embodiments of FIGS. 9 and 10, this invention is applied to a power source potential wiring.

In the FIG. 8 embodiment, the reference potential GND supplied to pad 16 is supplied to wave shaper circuit 11 and driver circuit 12 via common wiring 20, and is also supplied to bias generator circuit 13 via wiring 21. The power source potential Vcc supplied to pad 15 is supplied to driver circuit 12 via wiring 18, and to bias generator circuit 13 via wiring 19. The power source potential Vcc supplied to pad 23 is supplied only to wave shaper circuit 11 via wiring 24.

As described above, in the fourth embodiment, pad 23 for supplying the power source potential Vcc to wave shaper circuit 11 is provided independently of pad 15 for supplying the power source potential Vcc to the other circuits. Also, the power source potential Vcc supplied to pad 23 is supplied to wave shaper circuit 11 via independent wiring 24.

With such a configuration of the circuit the power potential supply system for wave shaper circuit 11 is separated from driver circuit 12 handling a large current. For the reason above, in the power source potential system for wave shaper circuit 11, i.e., the path extending from pad 23 to wiring 24, there occurs little variation in the potential due to the instantaneous AC current. Therefore, the operation point of wave shaper circuit 11 is kept constant. No erroneous operation will occur, even if a clock signal with an amplitude smaller than that conventionally used is input. It should be noted that even if wiring 21 is connected to wiring 20 instead of pad 16, the effect of the invention remains the same.

FIG. 9 shows a block diagram illustrating a configuration of a semiconductor circuit according to a fifth embodiment of this invention. In the fifth embodiment, unlike the fourth embodiment of FIG. 8, wiring 19 for supplying the power source potential Vcc to bias generator circuit 13 is connected not to pad 15 which is connected to driver circuit 12, but to pad 23 which is connected to wave shaper circuit 11.

Specifically, in this embodiment, pad 23 for supplying the power source potential Vcc to wave shaper circuit 11 is commonly used in the circuits (wave shaper circuit 11, bias generator circuit 13) other than driver circuit 12 handling a large current. Wave shaper circuit 11 is supplied with the power source potential Vcc from pad 23 via wiring 24.

In this embodiment also, the power source potential supply system for wave shaper circuit 11 is separated from driver circuit 12 handling a large current. Therefore, the operation point of wave shaper circuit 11 is kept constant. No erroneous operation will occur, even if a clock signal with an amplitude smaller than that conventionally used is input.

FIG. 10 shows a block diagram illustrating a semiconductor circuit according to a sixth embodiment of this invention. Only one pad 15 is provided for supplying the power source potential Vcc to all the circuits. The power source potential Vcc is supplied from pad 15 to wave shaper circuit 11 via wiring 25, to driver circuit 12 via wiring 18, and to bias generator circuit 13 via wiring 19.

Namely, in this embodiment, pad 15 is used for supplying the power source potential Vcc to the circuits including driver circuit 12. Wave shaper circuit 11 is supplied with the power source potential Vcc via independent wiring 25.

Figure 11:
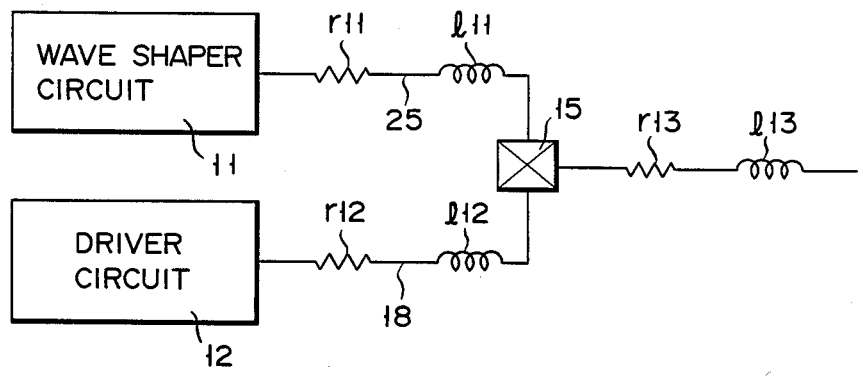
FIG. 11 is an equivalent circuit of the wave shaper circuit and the driver circuit in the circuit shown in FIG. 10, as seen from the reference potential pad.

FIG. 11 shows a diagram of an equivalent circuit of the power source potential wiring and its related circuitry of the circuit shown in FIG. 10. In the figure, resistance r11 and inductance l11 are parasitic to wiring 25. Also, resistance r12 and inductance l12 are parasitic to wiring 18. Resistance r13 and inductance L13 are parasitic to the bonding wire (not shown) connecting pad 15 to an external pin (not shown) of the semiconductor circuit.

In this embodiment, the potential variation of wiring 18 arising from the instantaneous AC current generated by driver circuit 12 is absorbed by the path formed by pad 15, the bonding wire and the external pin. Since the bonding wire and the external pin have some impedance, the potential variation of pad 15 is transferred to wave shaper circuit 11 via wiring 25. However, the potential variation of pad 15 is greatly decreased, compared with that in the prior art. No erroneous operation will occur, even if a clock signal with an amplitude smaller than that used in the prior art is input.

Figure 12:
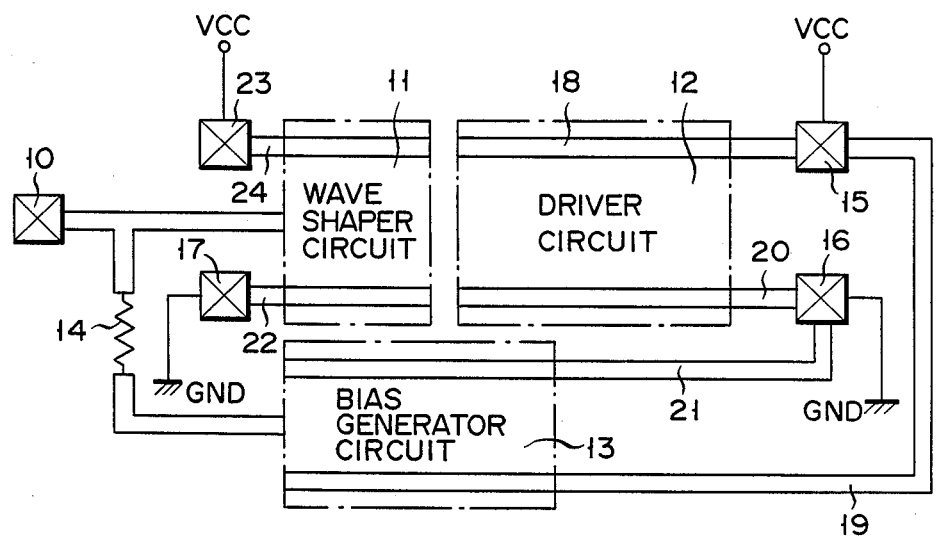

FIG. 12 shows a block circuit diagram illustrating a semiconductor circuit according to a seventh embodiment of this invention. In the seventh embodiment, the FIG. 4 embodiment and the FIG. 8 embodiment are combined. In this embodiment and the embodiments of FIGS. 13 to 20, this invention is applied to both the reference potential wiring and the power source potential wiring.

In the FIG. 12 embodiment, the reference potential GND supplied to pad 16 is supplied to driver circuit 12 via wiring 20, and to bias generator circuit 13 via wiring 21. Wave shaper circuit 11 is supplied with the reference potential GND from pad 17 via wiring 22. The power source potential Vcc supplied to pad 15 is supplied to driver circuit 12 via wiring 18, and to bias generator circuit 13 via wiring 19. Wave shaper circuit 11 is supplied with the power source potential Vcc from pad 23 via wiring 24.

As described above, in this embodiment, pad 17 for supplying the reference potential GND to wave shaper circuit 11 is provided independently of pad 16 for supplying the reference potential GND to the other circuits. Also, the reference potential supplied to pad 17 is supplied to wave shaper circuit 11 via independent wiring 22.

Also, pad 23 for supplying the power source potential Vcc to wave shaper circuit 11 is provided independently of pad 15 for supplying the power source potential Vcc to the other circuits. Also, the power source potential Vcc supplied to pad 23 is supplied to wave shaper circuit 11 via independent wiring 24.

With such a configuration of the circuit, the reference potential supply system and the power source potential supply system for wave shaper circuit 11 are separated from driver circuit 12 handling a large current. For the reason above, in the reference potential system, i.e., the path extending from pad 17 to wiring 22, and in the power source potential supply system, i.e., the path extending from pad 23 to wiring 24 for wave shaper circuit 11, there occurs little variation in the potential due to the instantaneous AC current. Therefore, the operation point of wave shaper circuit 11 is kept constant. No erroneous operation will occur, even if a clock signal with an amplitude smaller than that conventionally used is input. It should be noted that even if wiring 21 is connected to wiring 20 instead of pad 16, the effect of the invention remains the same.

Figure 13:
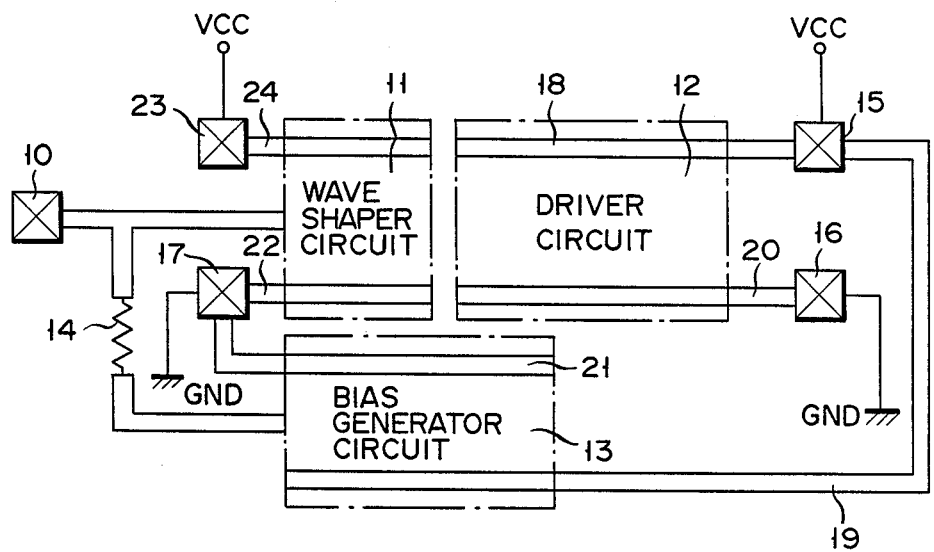

FIG. 13 shows a block diagram illustrating a configuration of a semiconductor circuit according to an eighth embodiment of this invention. In this embodiment, the FIG. 5 embodiment and the FIG. 8 embodiment are combined. In this embodiment, unlike the embodiment of FIG. 12, wiring 21 for supplying the reference potential GND to bias generator circuit 13 is connected not to pad 16, which is connected to driver circuit 12, but to pad 17, which is connected to wave shaper circuit 11.

Specifically, in this embodiment, pad 17 for supplying the reference potential GND to wave shaper circuit 11 is commonly used in the circuits (wave shaper circuit 11, bias generator circuit 13) other than driver circuit 12 handling a large current. Wave shaper circuit 11 is supplied with the reference potential GND from pad 17 via wiring 22.

In this embodiment also, the reference potential supply system and the power source potential supply system for wave shaper circuit 11 are separated from driver circuit 12 handling a large current. Therefore, the operation point of wave shaper circuit 11 is kept constant. No erroneous operation will occur, even if a clock signal with an amplitude smaller than that conventionally used is input.

FIG. 14 shows a block diagram illustrating a semiconductor circuit according to a ninth embodiment of this invention. In this embodiment, the FIG. 6 embodiment and the FIG. 8 embodiment are combined. Only one pad 16 is provided for supplying the reference potential GND to all the circuits. The reference potential GND is supplied from pad 16 to wave shaper circuit 11 via wiring 22, to driver circuit 12 via wiring 20, and to bias generator circuit 13 via wiring 21.

In this embodiment, pad 16 is used for supplying the reference potential GND to the circuits including driver circuit 12. Wave shaper circuit 11 is supplied with the reference potential GND via independent wiring 22.

In this embodiment, the potential variation of wiring 20 arising from the instantaneous AC current generated by driver circuit 12 is absorbed by the path formed by pad 16, the bonding wire (not shown) and the external pin (not shown). Since the bonding wire and the external pin have some impedance, the potential variation of pad 16 is transferred to wave shaper circuit 11 via wiring 22. However, the potential variation of pad 16 is greatly decreased, compared with that in the prior art circuit. No erroneous operation will occur, even if a clock signal with an amplitude smaller than that used in the prior art is input.

FIG. 15 shows a block circuit diagram illustrating a semiconductor circuit according to a tenth embodiment of this invention. In this embodiment, the FIG. 4 embodiment and the FIG. 9 embodiment are combined.

In the FIG. 15 embodiment, the reference potential GND supplied to pad 16 is supplied to driver circuit 12 via wiring 20, and to bias generator circuit 13 via wiring 21. Wave shaper circuit 11 is supplied with the reference potential GND from pad 17 via wiring 22. The power source potential Vcc supplied to pad 15 is supplied to driver circuit 12 via wiring 18. Wave shaper circuit 11 and bias generator circuit 13 are supplied with the power source potential Vcc from pad 23, respectively via wirings 24 and 19.

As described above, in this embodiment, pad 17 for supplying the reference potential GND to wave shaper circuit 11 is provided independently of pad 16 for supplying the reference potential GND to the other circuits. Also, the reference potential supplied to pad 17 is supplied to wave shaper circuit 11 via independent wiring 22.

Furthermore, in this embodiment, unlike the embodiments of FIGS. 12 to 14, wiring 19 for supplying the power source potential Vcc to bias generator circuit 13 is connected not to pad 15, which is connected to driver circuit 12, but to pad 23, which is connected to wave shaper circuit 11.

Specifically, pad 23 for supplying the power source potential Vcc to wave shaper circuit 11 is commonly used in the circuits (wave shaper circuit 11, bias generator circuit 13) other than driver circuit 12 handling a large current. Wave shaper circuit 11 is supplied with the power source potential Vcc from pad 23 via wiring 24.

With such a configuration, the reference potential supply system and the power source potential supply system for wave shaper circuit 11 are separated from driver circuit 12 handling a large current. For the reason above, in the reference potential supply system, i.e., the path extending from pad 17 to wiring 22, and in the power source potential supply system, i.e., the path extending from pad 23 to wiring 24 for wave shaper circuit 11, there occurs little variation in the potential due to the instantaneous AC current. Therefore, the operation point of wave shaper circuit 11 is kept constant. No erroneous operation will occur, even if a clock signal with an amplitude smaller than that conventionally used is input. It should be noted that even if wiring 21 is connected to wiring 20 instead of pad 16, the effect of the invention remains the same.

FIG. 16 shows a block diagram illustrating a configuration of a semiconductor circuit according to an eleventh embodiment of this invention. In this embodiment, the FIG. 5 embodiment and the FIG. 9 embodiment are combined. In this embodiment, unlike the embodiment of FIG. 15, wiring 21 for supplying the reference potential GND to bias generator circuit 13 is connected not to pad 16, which is connected to driver circuit 12, but to pad 17, which is connected to wave shaper circuit 11.

Specifically, in this embodiment, pad 17 for supplying the reference potential GND to wave shaper circuit 11 is commonly used in the circuits (wave shaper circuit 11, bias generator circuit 13) other than driver circuit 12 handling a large current. Wave shaper circuit 11 is supplied with the reference potential GND from pad 17 via wiring 22.

In this embodiment also, the reference potential supply system and the power source potential supply system for wave shaper circuit 11 are separated from driver circuit 12 handling a large current. Therefore, the operation point of wave shaper circuit 11 is kept constant. No erroneous operation will occur, even if a clock signal with an amplitude smaller than that conventionally used is input.

FIG. 17 shows a block diagram illustrating a semiconductor circuit according to a twelfth embodiment of this invention. In this embodiment, the FIG. 6 embodiment and the FIG. 9 embodiment are combined.

In this embodiment, only one pad 16 is provided for supplying the reference potential GND to all the circuits. The reference potential GND is supplied from pad 16 to wave shaper circuit 11 via wiring 22, to driver circuit 12 via wiring 20, and to bias generator circuit 13 via wiring 21.

Namely, in this embodiment, pad 16 is used for supplying the reference potential GND to the circuits including driver circuit 12. Wave shaper circuit 11 is supplied with the reference potential GND via independent wiring 22.

In this embodiment, the potential variation of wiring 20 arising from the instantaneous AC current generated by driver circuit 12 is absorbed by the path formed by pad 16, the bonding wire (not shown) and the external pin (not shown). Since the bonding wire and the external pin have some impedance, the potential variation of pad 16 is transferred to wave shaper circuit 11 via wiring 22. However, the potential variation of pad 16 is greatly decreased, compared with that in the prior art. No erroneous operation will occur, even if a clock signal with an amplitude smaller than that used in the prior art is input.

Figure 18:
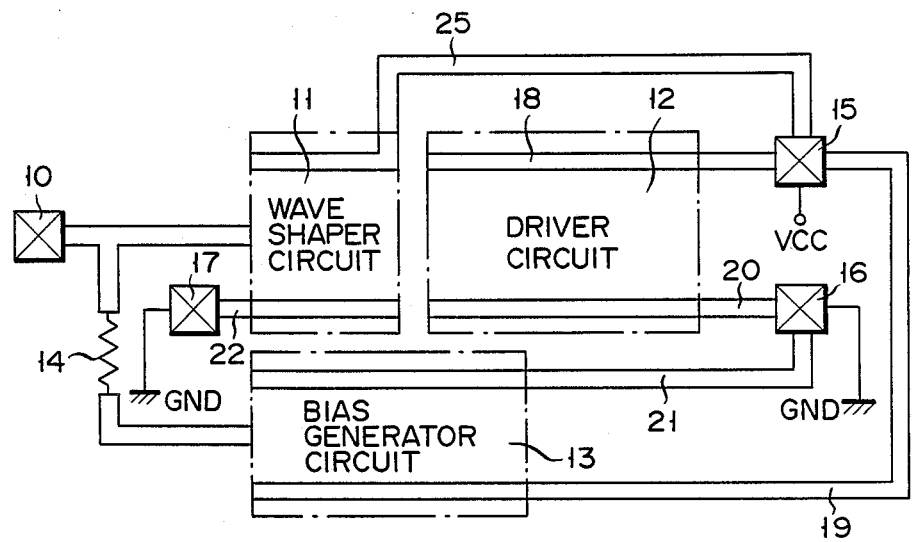

FIG. 18 shows a block circuit diagram illustrating a semiconductor circuit according to a thirteenth embodiment of this invention. In the thirteenth embodiment, the FIG. 4 embodiment and the FIG. 10 embodiment are combined.

In the FIG. 18 embodiment, the reference potential GND supplied to pad 16 is supplied to driver circuit 12 via wiring 20, and to bias generator circuit 13 via wiring 21. Wave shaper circuit 11 is supplied with the reference potential GND from pad 17 via wiring 22. The power source potential Vcc supplied to pad 15 is supplied to driver circuit 12 via wiring 18, to bias generator circuit 13 via wiring 19, and to wave shaper circuit via wiring 25.

As described above, in this embodiment, pad 17 for supplying the reference potential GND to wave shaper circuit 11 is provided independently of pad 16 for supplying the reference potential GND to the other circuits. Also, the reference potential supplied to pad 17 is supplied to wave shaper circuit 11 via independent wiring 22.

Furthermore, only one pad 15 is provided for supplying the power source potential Vcc to all the circuits. The power source potential Vcc is supplied to wave shaper circuit 11 via wiring 25, to driver circuit 12 via wiring 18, and to bias generator circuit 13 via wiring 19.

Namely, pad 15 is used for supplying the power source potential Vcc to the circuits including driver circuit 12. Wave shaper circuit 11 is supplied with the power potential Vcc via independent wiring 25 from pad 15.

With such a configuration of the circuit, the reference potential supply system for wave shaper circuit 11 is separated from driver circuit 12 handling a large current. For the reason above, in the reference potential supply system for wave shaper circuit 11, i.e., the path extending from pad 17 to wiring 22, there occurs little variation in the potential due to the instantaneous AC current.

In the power source potential supply system, the potential variation of wiring 18 arising from the instantaneous AC current generated by driver circuit 12 is absorbed by the path formed by pad 15, the bonding wire and the external pin. Since the bonding wire and the external pin have some impedance, the potential variation of pad 15 is transferred to wave shaper circuit 11 via wiring 25. However, the potential variation of pad 15 is greatly decreased, compared with that in the prior art. No erroneous operation will occur, even if a clock signal with an amplitude smaller than that used in the prior art is input.

It should be noted that even if wiring 21 is connected to wiring 20 instead of pad 16, the effect of the invention remains the same.

Figure 19:
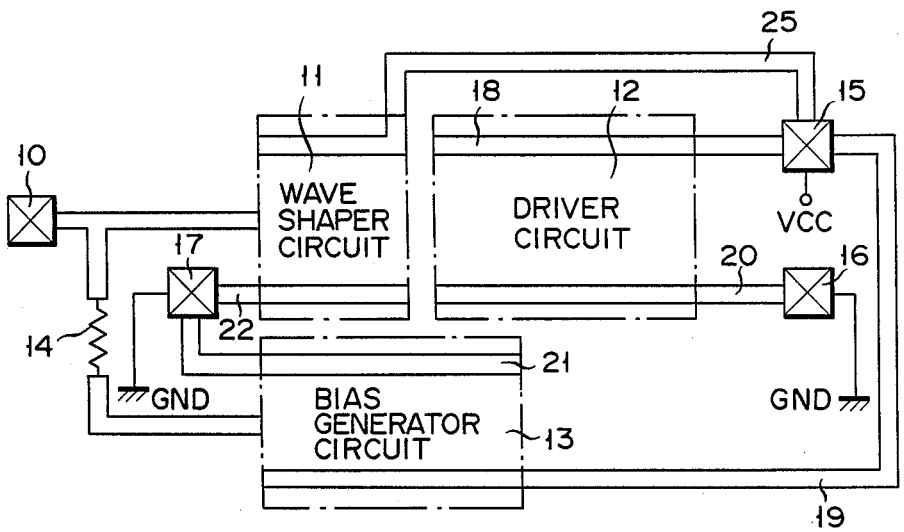

FIG. 19 shows a block diagram illustrating a configuration of a semiconductor circuit of a fourteenth embodiment of this invention. In this embodiment, the FIG. 5 embodiment and the FIG. 10 embodiment are combined. In this embodiment, unlike the embodiment of FIG. 18, wiring 21 for supplying the reference potential GND to bias generator circuit 13 is connected not to pad 16, which is connected to driver circuit 12, but to pad 17, which is connected to wave shaper circuit 11.

Specifically, in this embodiment, pad 17 for supplying the reference potential GND to wave shaper circuit 11 is commonly used to the circuits (wave shaper circuit 11, bias generator circuit 13) other than driver circuit 12 handling a large current. Wave shaper circuit 11 is supplied with the reference potential GND from pad 17 via wiring 22.

In this embodiment, the reference potential supply system for wave shaper circuit 11 is separated from driver circuit 12 handling a large current. Therefore, the operation point of wave shaper circuit 11 is kept constant. No erroneous operation will occur, even if a clock signal with an amplitude smaller than that conventionally used is input.

FIG. 20 shows a block diagram illustrating a semiconductor circuit according to a fifteenth embodiment of this invention. In this embodiment, the FIG. 6 embodiment and the FIG. 10 embodiment are combined. In this embodiment, only one pad 16 is provided for supplying the reference potential GND to all the circuits. The reference potential GND is supplied from pad 16 to wave shaper circuit 11 via wiring 22, to driver circuit 12 via wiring 20, and to bias generator circuit 13 via wiring 21.

In this embodiment, pad 16 is used for supplying the reference potential GND to the circuits including driver circuit 12. Wave shaper circuit 11 is supplied with the reference potential GND via independent wiring 22.

In this embodiment, the potential variation of wiring 20 arising from the instantaneousl AC current generated by driver circuit 12 is absorbed by the path formed by pad 16, the bonding wire and the external pin. Also, the potential variation of wiring 18 arising from the instantaneous AC current generated by driver circuit 12 is absorbed by the path formed by pad 15, the bonding wire (not shown) and the external pin (not shown). Since the bonding wires and the external pins have some impedance, the potential variations of pads 16 and 15 are transferred to wave shaper circuit 11, respectively, via wirings 22 and 25. However, the potential variations of pads 16 and 15 are greatly decreased, compared with those in the prior art. No erroneous operation will occur, even if a clock signal with an amplitude smaller than that used in the prior art is input.

FIG. 21 shows a detailed configuration of the semiconductor circuit of the above-mentioned embodiments. In the figure, the bias generator circuit is shown as a block.

Wave shaper circuit 11 comprises three seriesconnected inverters 31, 32 and 33. The first stage inverter circuit 31 is connected to input terminal 10 of the semiconductor circuit. The final stage inverter circuit 33 is connected to the first stage logic circuit 40 of driver circuit 12. Driver circuit 12 comprises logic circuit 40, and two following stage drivers 50 and 60. Driver 50 includes two N channel MOS transistors 51 and 52 which are connected in series between power source potential Vcc and reference potential GND. Driver 60 includes N channel MOS transistors 61 and 62 which are connected in series between power source potential Vcc and reference potential GND. Logic circuit 40 controls the operation of drivers 50 and 60 so that the two transistors in each of drivers 50 and 60 will not be turned on simultaneously and, consequently, no current will flow. Logic circuit 40 comprises two NOR gate circuits 41 and 42 and inverter circuit 43. The input terminal of inverter 43 is connected to the output terminal of wave shaper circuit 11, i.e., the output terminal of inverter circuit 33. The output terminal of wave shaper circuit 11 is further connected to the gate of MOS transistor 62 of driver 60, and to a first input terminal of NOR gate circuit 42. The output terminal of inverter 43 is connected to the first input terminal of NOR gate circuit 41, and is also connected to the gate of MOS transistor 51 of driver 50. The second input terminal of NOR gate circuit 41 is connected to node 63 of two MOS transistors 61 and 62 of driver 60. Similarly, the second input terminal of NOR gate circuit 42 is connected to node 53 of two MOS transistors 51 and 52 of driver 50. The output pulse signals $\bar{\phi}$ and $\phi$ with opposite phases are obtained from nodes 53 and 63.

Bias generator circuit 13 has such a configuration that is receives the signal $\bar{\phi}$ and $\phi$, and compares the duties of the signals, and generates a DC bias voltage based on the comparison result, for example, a DC bias voltage causing the signal $\bar{\phi}$ and $\phi$ to have 50% duties. Alternatively, the bias generator circuit 13 may be made of a resistor circuit or a fixed bias voltage circuit, which generates a fixed bias voltage. The number of inverter circuits of wave shaper circuit 11 is not limited to 3, but one or two, or four or more inverter circuits may be used according to the delay time to be set.

FIG. 22 shows a detailed configuration of bias generator circuit 13, which receives signals $\bar{\phi}$ and $\phi$ and generates a DC bias which causes the signals $\bar{\phi}$ and $\phi$ to have 50% duties.

Bias generator circuit 13 includes resistor 72 and capacitor 74. The first end of resistor 72 is supplied with pulse signal $\phi$. The second end of resistor 72 is connected to the inverting input terminal (−) of comparator 71. Capacitor 74 is connected between the second end of resistor 72 and ground potential. Resistor 72 and capacitor 74 constitute integrating circuit 73. Bias generator circuit 13 also includes resistor 75 with the same resistance as that of resistor 72, and capacitor 77 with the same capacitance as that of capacitor 74. The first end of resistor 75 is supplied with pulse signal $\bar{\phi}$. The second end of resistor 75 is connected to the non-inverting input terminal (+) of comparator 71. Capacitor 77 is connected between the second end of resistor 75 and ground potential. Resistor 75 and capacitor 77 constitute integrating circuit 76.

The amplitude of pulse signal $\phi$ is integrated by integrating circuit 73 of resistor 72 and capacitor 74. The integration value is input to inverting input terminal (−) of comparator 71. The amplitude of pulse signal $\bar{\phi}$ is integrated by integrating resistor 75 and capacitor 77. The integration value is input to the non-inverting input terminal (+) of comparator 71. The two integration values are compared by comparator 71. The difference signal between these integration values is output from the comparator, as an output bias signal of this bias generator circuit. This difference signal is used for determining the 50% duty.

FIG. 23 shows a circuit configuration of a semiconductor circuit according to the sixteenth embodiment of this invention, in which phase-locked loop (PLL) circuit 80 is inserted between wave shaper circuit 11 and driver circuit 12. Pulse signals $\bar{\phi}$ and $\phi$ with a frequency two or more times as high as that of the signal input to input terminal 10, i.e., that of the output signal of wave shaper circuit 11, are obtained by PPL circuit 80.

FIG. 24 shows a configuration of PLL circuit 80.

Phase detector 81 compares the phase of signal IN from wave shaper circuit 11 and the phase of the signal of frequency divider 82. Phase detector 81 then supplies a voltage signal in accordance with the phase difference to voltage-controlled oscillator 83. Oscillator 83 outputs a signal of a frequency in accordance with the voltage signal input from phase detector 81. This signal is input to frequency divider 82. The output frequency of frequency divider 82 changes according to the frequency of the signal. The output signal of frequency divider 82 is input to phase detector 81, where the phase of the signal and that of input signal IN are compared. This sequence of operations is repeatedly preformed, so that input signal IN is in phase with the output signal of frequency divider 82. The output signal of oscillator 82 is taken out as an output signal of PLL circuit 80, and is input to driver circuit 12. Numeral 84 denotes a bonding pad for phase detector 81 and voltage controlled oscilator 83. Numeral 85 is a capacitor connected between bonding pad 84 and ground. The capacitor is used to pass therethrough the AC component of the output signal of phase detector 81 to ground.

FIG. 25 shows a circuit diagram of a semiconductor circuit according to the seventeenth embodiment of this invention, in which a frequency divider is inserted between wave sharper circuit 11 and driver circuit 12. Pulse signal $\bar{\phi}$ and $\phi$, whose frequency is a fraction of the level of the signal input to input terminal 10, i.e., that of the output signal of wave shaper circuit 11, are obtained in accordance with the division ratio as set by frequency divider 90.

The above-mentioned embodiments can each be used as a circuit for driving a CCD (charge coupled device) delay line which is used in a video cassette recorder and so on, for handling a video signal. In such a case, the value of the DC bias voltage output from bias generator circuit 13 is determined such that pulse signals $\bar{\phi}$ and $\phi$ may have 50% duties. Based on the signal $\bar{\phi}$ and $\phi$ the CCD is driven.

The CCD assumes a load capacitance of several tens to several hundreds of pF. It is necessary to drive the CCD with a high charge transfer efficiency, using a small-amplitude clock signal of a high frequency, such as 10.74 MHz. If this invention is applied to such a circuit, the effects obtained are extremely great.

It should be understood that the invention is not limited to its application to the CCD as a load circuit, but is applicable to MOS type integrated circuits and bipolar integrated circuits.

The circuit of this invention may be not only formed as an integrated circuit, but also as a discrete circuit.

What is claimed is:

1. A semiconductor circuit comprising:
   a signal input terminal supplied with an input signal;
   a wave shaper circuit for amplifying and wave-shaping said input signal supplied to said input terminal to form a pulse signal;
   a driver circuit for generating a signal to drive a circuit with a load capacity by using said pulse signal;
   a bias voltage generator circuit for applying a DC bias voltage to said signal input terminal to bias said input signal; and
   potential supply means for supplying at least one of a reference potential and a power source potential to said wave shaper circuit, independently of the supply of said at least one of a reference potential and a power source potential to said driver circuit.

2. The semiconductor circuit according to claim 1, wherein said potential supply means comprises a reference potential supplying bonding pad exclusively supplying said reference potential to said wave shaper circuit, and a reference potential supplying wiring connected between said reference potential supplying bonding pad and said wave shaper circuit.

3. The semiconductor circuit according to claim 1, wherein said potential supply means comprises a reference potential supplyinhg bonding pad commonly supplying said reference potential to circuits other than said driver circuit, and a reference potential supplying wiring connected between between said reference potential supplying bonding pad and said wave shaper circuit.

4. The semiconductor circuit according to claim 1, wherein said potential supply means comprises a reference potential supplying bonding pad commonly supplying said reference potential to circuits including said driver circuit, and a reference potential supplying wiring connected between said reference potential supplying bonding pad and said wave shaper circuit.

5. The semiconductor circuit according to claim 1, wherein said potential supply means comprises a power source potential supplying bonding pad exclusively supplying said power source potential to said wave shaper circuit, and a power source potential supplying wiring connected between said power source potential supplying bonding pad and said wave shaper circuit.

6. The semiconductor circuit according to claim 1, wherein said potential supply means comprises a power source potential supplying bonding pad commonly supplying said power source potential to circuits other than said driver circuit, and a power source potential supplying wiring connected between said power source potential supplying bonding pad and said wave shaper circuit.

7. The semiconductor circuit according to claim 1, wherein said potential supply means comprises a power source potential supplying bonding pad commonly supplying said power source potential to circuits including said driver circuit, and a power source potential supplying wiring connected between said power source supplying bonding pad and said wave shaper circuit.

8. The semiconductor circuit according to claim 1, wherein said potential supply means comprises a first bonding pad exclusively supplying said reference potential to said wave shaper circuit, and a reference potential supplying wiring connected between said first bonding pad and said wave shaper circuit, and a second bonding pad, exclusively supplying said power source potential to said wave shaper circuit, and a power source potential supplying wiring connected between the second pad and said wave shaper circuit.

9. The semiconductor circuit according to claim 1, wherein said potential supply means comprises a reference potential supplying bonding pad commonly supplying said reference potential to circuits other than said driver circuit, a reference potential supplying wiring connected between said reference potential supplying bonding pad and said wave shaper circuit, a power source potential supplying bonding pad exclusively supplying said power source potential to said wave shaper circuit, and a power source potential supplying wiring connected between said power source potential supplying bonding pad and said wave shaper circuit.

10. The semicondcutor circuit according to claim 1, wherein said potential supply means comprises a reference potential supplying bonding pad commonly supplying said reference potential to circuits including said driver circuit, a reference potential supplying wiring connected between said reference potential supplying bonding pad and said wave shaper circuit, a power source potential supplying bonding pad exclusively supplying said power source potential to said wave shaper circuit, and a power source potential supplying wiring connected between said power source potential supplying bonding pad and said wave shaper circuit.

11. The semiconductor circuit according to claim 1, wherein said potential supply means comprises a reference potential supplying bonding pad exclusively supplying said reference potential to said wave shaper circuit, a reference potential supplying wiring connected between said reference potential supplying bonding pad and said wave shaper circuit, a power source potential supplying bonding pad commonly supplying said power source potential to circuits other than said driver circuit, and a power source potential supplying wiring connected between said power source potential supplying bonding pad and said wave shaper circuit.

12. The semiconductor circuit according to claim 1, wherein said potential supply means comprises a reference potential supplying bonding pad commonly supplying said reference potential to circuits other than said driver circuit, a reference potential supplying wiring connected between said reference potential supplying bonding pad and said wave shaper circuit, a power source potential supplying bonding pad commonly supplying said power source potential to circuits other than said driver circuit, and a power source potential supplying wiring connected between said power source potential supplying bonding pad and said wave shaper circuit.

13. The semiconductor circuit according to claim 1, wherein said potential supply means comprises a reference potential supplying bonding pad commonly supplying said reference potential to circuits including said driver circuit, a reference potential supplying wiring connected between said reference potential supplying bonding pad and said wave shaper circuit, a power source potential supplying bonding pad commonly supplying said power source potential to circuits other than said driver circuit, and a power source potential supplying wiring connected between said power source potential supplying bonding pad and said wave shaper circuit.

14. The semiconductor circuit according to claim 1, wherein said potential supply means comprises a reference potential supplying bonding pad exclusively supplying said reference potential to said wave shaper circuit, a reference potential supplying wiring connected between said reference potential supplying bonding pad and said wave shaper circuit, a power source potential supplying bonding pad commonly supplying said power source potential to circuits including said driver circuit, and a power source potential supplying wiring connected between said power source supplying bonding pad and said wave shaper circuit.

15. The semiconductor circuit according to claim 1, wherein said potential supply means comprises a reference potential supplying bonding pad commonly supplying said reference potential to circuits other than said driver circuit, a reference potential supplying wiring connected between said reference potential supplying bonding pad and said wave shaper circuit, a power source potential supplying bonding pad commonly supplying said power source potential to circuits including said driver circuit, and power source potential supplying wiring connected between said power source supplying bonding pad and said wave shaper circuit.

16. The semiconductor circuit according to claim 1, wherein said potential supply means comprises a reference potential supplying bonding pad commonly supplying said reference potential to circuits including said driver circuit, a reference potential supplying wiring connected between said reference potential supplying bonding pad and said wave shaper circuit, a power source potential supplying bonding pad commonly supplying said power source potential to circuits including said driver circuit, and a power source potential supplying wiring connected between said power source supplying bonding pad and said wave shaper circuit.

17. The semiconductor circuit according to claim 1, further comprising a frequency multiplying circuit inserted between said wave shaper circuit and said driver circuit.

18. The semiconductor circuit according to claim 17, wherein said frequency multiplying circuit is a phase-locked loop circuit.

19. The semiconductor circuit according to claim 1, further comprising a frequency dividing circuit inserted between said wave shaper circuit and said driver circuit.

20. A semiconductor circuit comprising:
a signal input terminal supplied with an input signal;
a wave shaper circuit for amplifying and wave-shaping said input signal supplied to said input terminal to form a pulse signal;
a driver circuit for generating a signal to drive a circuit with a load capacity by using said pulse signal;
a bias voltage generator circuit for applying a DC bias voltage to said signal input terminal to bias said input signal; and
potential supply means for supplying a fixed potential to said wave shaper circuit, independently of the supply of said fixed potential to said driver circuit.

* * * * *